United States Patent [19]
Bencuya et al.

[11] Patent Number: 4,779,123
[45] Date of Patent: Oct. 18, 1988

[54] INSULATED GATE TRANSISTOR ARRAY

[75] Inventors: Izak Bencuya; Adrian I. Cogan, both of San Jose, Calif.

[73] Assignee: Siliconix Incorporated, Santa Clara, Calif.

[21] Appl. No.: 808,904

[22] Filed: Dec. 13, 1985

[51] Int. Cl.[4] .................. H01L 29/78; H01L 27/10
[52] U.S. Cl. .................. 357/23.4; 357/23.8; 357/43; 357/65
[58] Field of Search .............. 357/43, 23.4, 23.8, 357/65

[56] References Cited

U.S. PATENT DOCUMENTS

| | | | |
|---|---|---|---|
| 3,484,796 | 12/1969 | Schuller | 357/65 |
| 4,344,081 | 8/1982 | Pao et al. | 357/43 |
| 4,364,073 | 12/1982 | Becke et al. | 357/23.4 |
| 4,495,513 | 1/1985 | Descamps | 357/23.8 |
| 4,584,593 | 4/1986 | Tihanyi | 357/23.4 |
| 4,631,564 | 12/1986 | Neilson et al. | 357/23.4 |
| 4,682,195 | 7/1987 | Yilmaz | 357/23.4 |
| 4,689,647 | 8/1987 | Nakagawa et al. | 357/23.4 |

FOREIGN PATENT DOCUMENTS

| | | | |
|---|---|---|---|
| 3411020 | 10/1984 | Fed. Rep. of Germany | 357/23.8 |
| 3519389 | 12/1985 | Fed. Rep. of Germany | 357/23.4 |
| 60-249367 | 12/1985 | Japan | 357/23.4 |

OTHER PUBLICATIONS

A. Nakagawa, "Non-Latch-Up 12000V 75A Bipolar-Mode MOSFET with: Large ASO", *IDEM* 84, pp. 860-861, Dec. 11, 1984, Wash. D.C., 16.8.

*Primary Examiner*—Andrew J. James
*Assistant Examiner*—Jerome Jackson
*Attorney, Agent, or Firm*—Alan H. MacPherson; Paul J. Winters; Brian D. Ogonowsky

[57] ABSTRACT

An insulated gate transistor (70) modified to increase its latching current density. On one side of gate (22), a high conductivity collector well (76) is provided to divert current which would otherwise flow through collector well (24) in a critical path (50) along source-collector junction (27), tending to forward bias the junction and cause the transistor to latch.

3 Claims, 5 Drawing Sheets

FIG.1a PRIOR ART DMOS

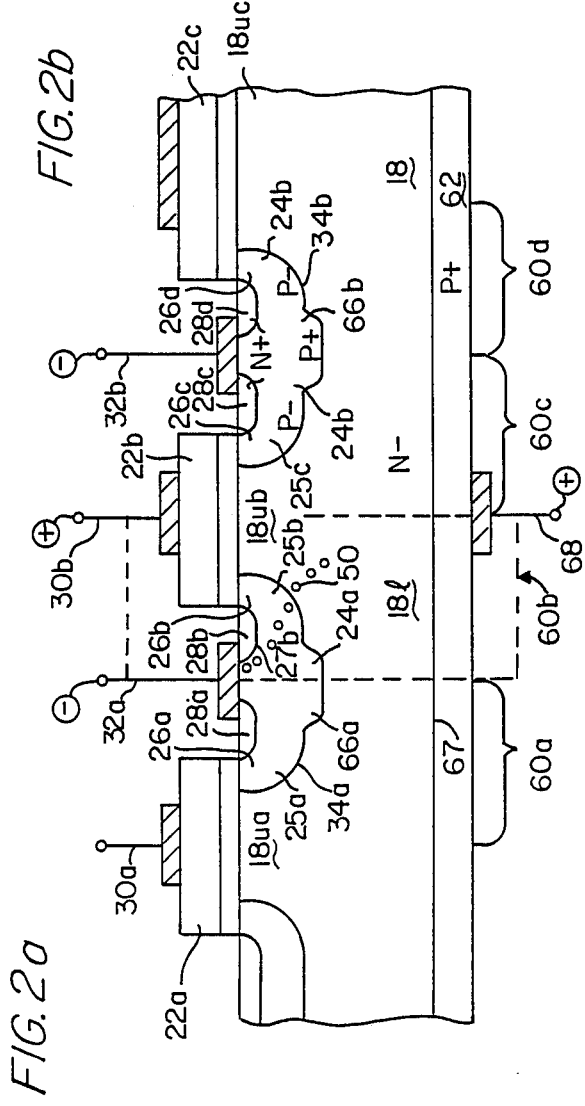
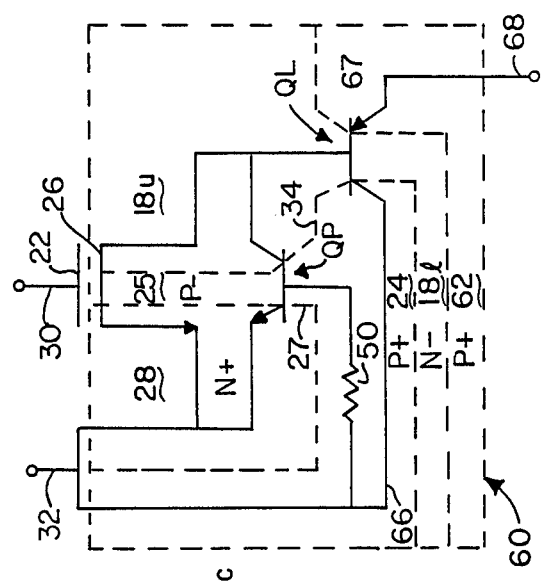
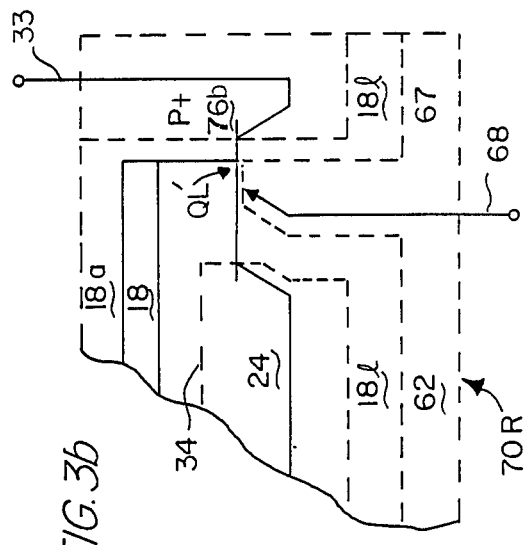
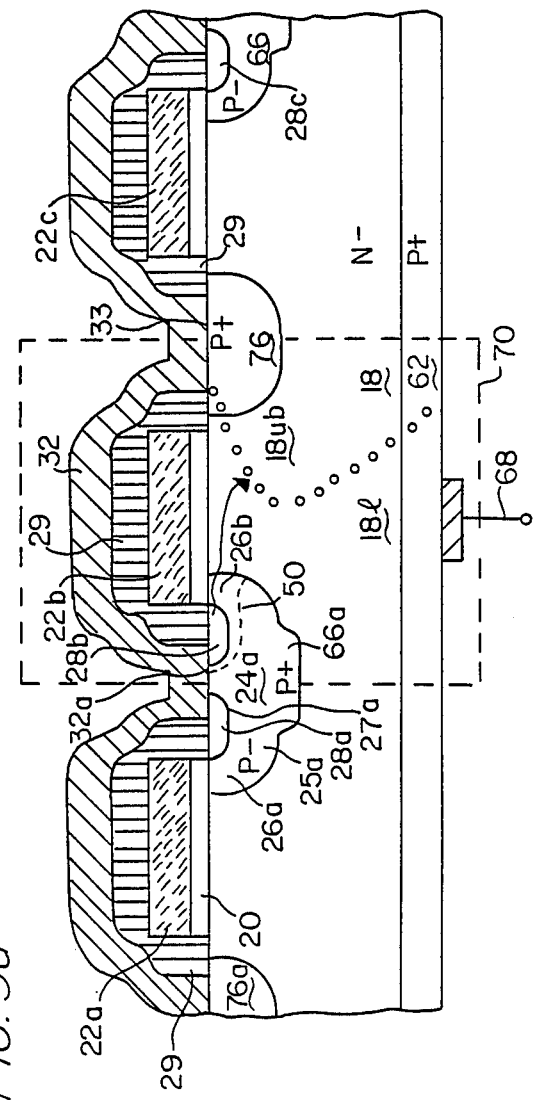

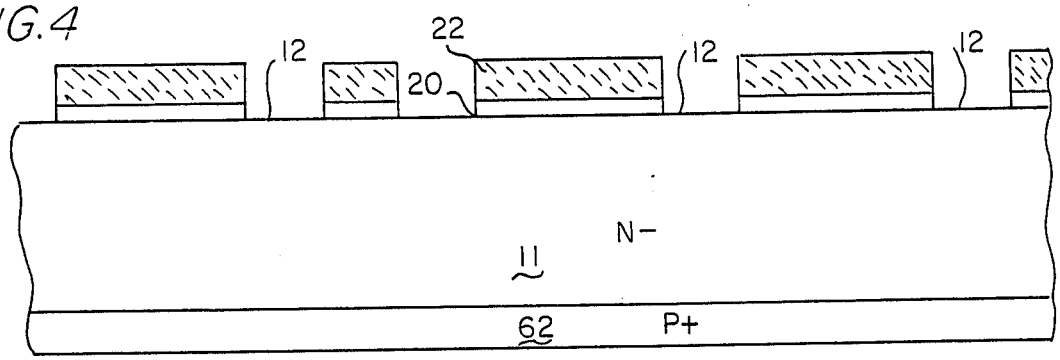
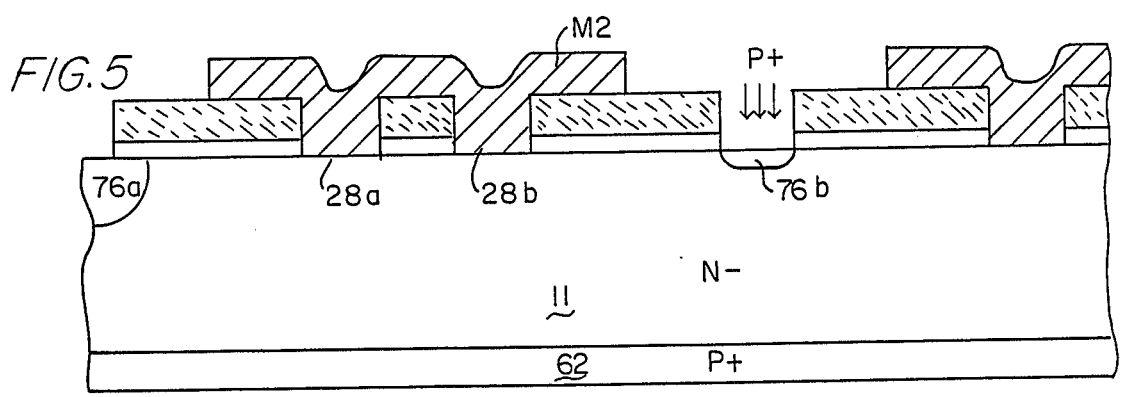
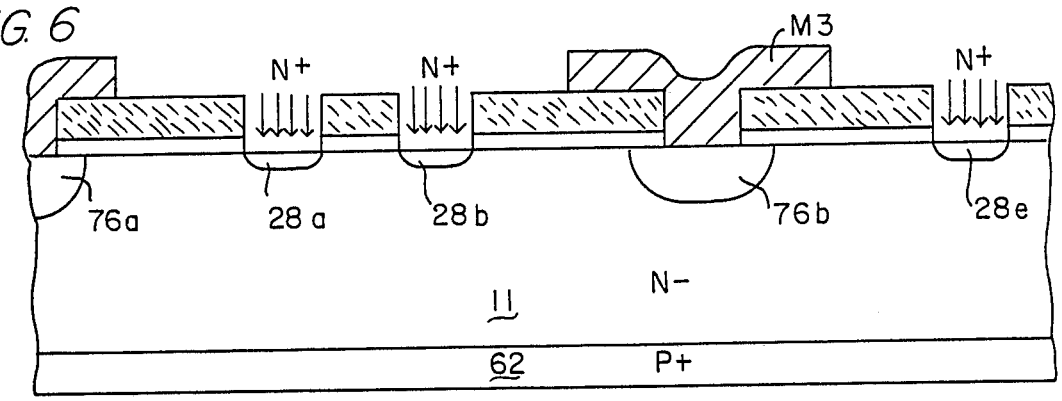
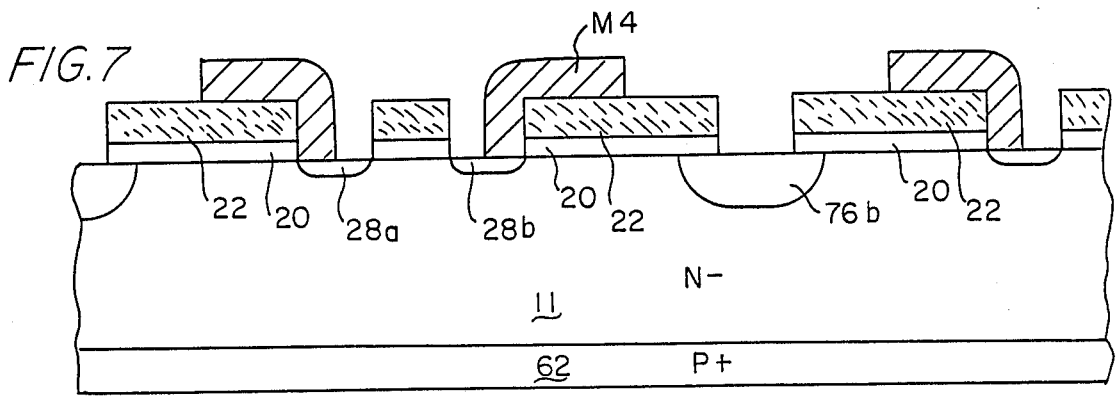

INSULATED GATE TRANSISTOR ARRAY

BACKGROUND OF THE INVENTION

This invention relates to power switching transistors, and more specifically to an Insulated Gate Transistor with increasing latching current capacity.

Field effect and bipolar transistors have different characteristics, suiting them for different uses.

In bipolar transistors, bipolar ("majority" and "minority" carrier) conduction through PN junctions and a large base area permits a high current density. However, PN junctions have a capacitance that must be charged in turning the transistor on, and discharged in turning it off, which slows the switching speed of bipolar transistors. In addition, excess minority and majority carriers in the case when the transistor begins to turn off must recombine before the transistor is completely turned off. During the relatively long intervals for switching on or off, the voltage and current through the transistor change, in opposite directions, and at intermediate values their product, power, is higher than when the transistor is not switching. The transistor dissipates power as heat. The ability of silicon to dissipate heat limits the current density rating of bipolar transistors placed in a given area of semiconductor material.

A metal oxide semiconductor field effect transistor (MOSFET) switches faster and dissipates less heat than a bipolar transistor of the same rating. A MOSFET is operated by applying a voltage potential to its gate electrode to establish an electric field from the gate through a layer of gate oxide and into underlying semiconductor material. The field inverts charges in an adjacent channel region beneath the oxide in the semiconductor material, which enables a current of majority charge carriers to flow between appropriately biased source and drain regions connected by the channel region. Having no counter-current of minority charge carriers in need of recombining with majority charge carriers, MOSFETs switch on and off very rapidly. Yet, with the channel being the only conduction path, a MOSFET does not conduct as much current as a same-size bipolar transistor rated for the same voltage. Consequently, MOSFETs have a lower current density.

An ideal power switching device would switch on and off at high speed in MOSFET mode, to conduct current at high density in bipolar mode when on, and be controllable by a gate electrode. Vertical MOS and double diffused MOS (DMOS) transistors are MOSFET structures adapted for power switching, i.e. switching large currents on and off.

Referring to FIG. 1a (not drawn to scale), in a typical prior art DMOS transistor 10, an N-type semiconductor substrate with upper surface 12 provides a drain region 18. Drain 18 includes upper drain region 18ub and lower drain region 18l. Backside terminal 15 contacts drain 18. Gate oxide layer 20 on surface 12 supports and insulates polysilicon gate 22b above upper drain 18ub. Referring to the portion of FIG. 1a near gate oxide 20 and terminal 32a, shown in the enlarged view of FIG. 1b, on either side of upper drain 18ub a P-type semiconductor channel body well such as well 24a has a thin wall 25b for forming conduction channel 26b beneath upper surface 12. P type well 24a contains source region 28b, which is heavily doped with N-type impurities. In a power DMOS structure, the edge regions of a well such as well 24a preferably each contain separate source regions 28a and 28b, (for clarity not shown in FIG. 1b but shown in FIG. 2a which relates to a slightly different structure). As shown in FIG. 2a, each source region 28a,b,c,d is adjacent one of gates 22a, 22b, and 22c. Each gate 22a, 22b, 22c bridges a respective upper drain region 18ua, 18ub, 18uc separating two adjacent well regions 24. Structure 10 is bilaterally symmetrical about an imaginary vertical center plane along center line $C_L$ (FIG. 1a) through the center of gate 22b and perpendicular to the plane of the drawing.

Referring to FIG. 1b, with a gate voltage applied to gate 22b which is greater than the conduction threshold voltage for channel 26b, and with drain 18 biased positively an appropriate amount with respect to source 28b, electrons flow from source 28b through channel 26b to upper drain 18ub, as indicated by the e⁻ arrow, and flow out drain terminal 15 (FIG. 1a). If source-well junction 27b becomes forward biased by more than 0.7 volts, thin and lightly doped well wall 25b functions as a base of a parasitic bipolar transistor. Electrons flow from source 28b not only through channel 26b but across forward biased junction 27b and through other parts of well 24a, and across junction 34a into lower drain 18l. In this event, the source-channel-drain structure works as a parasitic emitter-base-collector bipolar transistor. Bipolar conduction continues uncontrolled, even after gate lead 30b is externally shorted to emitter lead 32a to eliminate the field forming channel 26b and stop FET conduction. To stop bipolar conduction, the source-to-drain voltage difference must be externally reduced until junction 27b is no longer forward biased by as much as 0.7 volts.

To counter forward biasing of junction 27b, source region 28b and well 24a are typically shorted together by a source-emitter aluminum contact terminal 32a positioned on wafer surface 12 at point "S" (FIG. 1b) where source-well junction 27b meets surface 12, remote from channel 26b since shorting junction 27b adjacent channel 26b would interfere with current through the channel. Still, at a sufficient source-drain bias voltage (30 to 1000 votls, depending on the design, and hence rating, of device 10), reverse biased well-drain junction 34a breaks down, and a hole current starts from drain 18 across junction 34a and through well 24a. If, in spite of source-emitter shorting terminal 32a, sufficient current flows as illustrated by holes along a critical path 50 extending from upper drain 18ub laterally through the "pinched" region 23 of well 24a, parallel to junction 27b to terminal 32a, and if path 50 is sufficiently resistive, the voltage difference set up along path 50 will forward bias junction 27b around point "F" near upper drain 18ub (FIG. 1b), starting parasitic bipolar mode conduction and circumventing gate 22b turn-off ability.

Despite an externally applied reverse bias sufficient to break down junction 34a, forward biasing of junction 27b can be deterred if the voltage drop along path 50 is reduced, by narrowing source region 28b to shorten path 50, or by decreasing a resistivity of semiconductor material in the path.

U.S. Pat. No. 4,345,265 to Blanchard reduces the current and voltage difference along a path 50 in a DMOS transistor by selectively enlarging and increasing the conductivity of well 24 remote from channel 26 to form a "deep well" 66 (not shown for a DMOS transistor but shown in FIG. 2a for an IGT) to divert hole current from path 50. The P type conductivity of well 24a cannot be increased in well wall 25b near upper drain 18*ub* because that would prevent the field applied by gate 22*b* from inverting the conductivity of that region to form a conducting channel 26*b*. The deep well 66*a* portion of well 24*a* provides a more constant breakdown voltage along junction 34*a*. Also, the conductivity of well 24*a* being increased in the portion of deep well 66*a* near contact 32*a* provides a lower resistance path or short between the interior of well 24*a* and source region 28*b*. For voltage ratings exceeding 100 volts, the increased current density of DMOS transistors with deep wells 66 is still not comparable to that of bipolar transistors, and, for similar voltage ratings and die areas, DMOS transistors generally have a higher "on" resistance than bipolar transistors.

An insulated gate transistor (IGT) is a dual mode DMOS-like structure which switches on at high speed in MOS mode and obtains controlled high density conduction in bipolar mode. FIG. 2*a* (not to scale) shows a prior art IGT device. The regions in each space in FIG. 2*a* between the vertical axes of a gate terminal 30 on one side and a source-collector terminal 32 on the other side form respective IGTs 60*a*, 60*b*, 60*c*, and 60*d*. FIG. 2*b* shows the equivalent circuit for an IGT superimposed over the regions forming an IGT 60, with junctions 27, 34, and 67 indicated by dashed lines.

To operate both as a field effect transistor and as a bipolar transistor, an IGT such as 60*b* comprises four layers, in which three layers or regions 28*b*, 24*a*, and 18 of N+, P−, and N− type semiconductor material, respectively, are used for a source, channel body, and drain in an N-channel FET structure as in a DMOS transistor. For simplicity, corresponding regions of the structures of FIGS. 1*a* and 2*a* are numbered the same. Three lower regions 24*a*, 18, and 62 of P+, N−, and P+ type material, respectively, are used for a collector, base, and emitter in a bipolar transistor structure QL. The added fourth layer P+ emitter region (FIG. 2*a*) is provided by substrate 62, on which regions 18 are epitaxially grown. When starting to turn on, IGT 60*b* operates only in FET mode. While turning on, forward biased junction 67 makes region 62 function as part of drain 18*l*. When IGT 60*b* completes turning on, however, regions of IGT 60*b* also function in bipolar mode. Thus region 18 functions not only as a drain of an FET but also as the base of bipolar transistor QL; and well 24*a* functions not only as a channel of an FET but also as the collector 24 of transistor QL (FIG. 2*b*). Conventionally, P-implanted wells 24*a* and 24*b* (FIG. 2*a*) contain, in regions closely adjacent to but separated from upper drain region 18*ub*, N-implanted source regions 28*b* and 28*c*, respectively. The laterally opposed sides of each well 24*a* and 24*b* contain, as shown in FIG. 2*a*, source regions 28*a*, 28*b*, 28*c* and 28*d*. Channels 26*a*, 26*b*, 26*c*, and 26*d* are respectively formed between source regions 28*a*, 28*b*, 28*c* and 28*d* on the one hand, and the directly adjacent upper drain regions 18*ua*, 18*ub*, and 18*uc*, on the other hand.

Referring to both FIGS. 2*a* and 2*b*, a negative potential applied to terminal 68, relative to the potential of terminal 32*a*, reverse-biases junction 67, and blocks reverse current, for example during inductive load switching. A positive potential at terminal 68 relative the potential at terminal 32*a* reverse biases junction 34*a* and blocks forward current. At less than the breakdown voltage of either junction 34*a* or 67, lack of current through region 18, the base of transistor QL (FIG. 2*b*), prevents bipolar mode conduction in either direction.

Referring now to IGT 60*b* in FIG. 2*a*, when a positive voltage is applied to gate 22*b*, and drain region 18 is biased positive relative to source region 28*b*, electrons flow through channel 26*b*. This FET mode electron conduction provides a base current for bipolar transistor QL. FET mode electron current through forward biased junction 67 towards emitter 62 causes an opposite current of holes to be injected from emitter 62 back across junction 67. Minority carrier holes in base region 18 combine with electrons or are swept across reverse biased junction 34*a* to collector 24*a* of transistor QL. Bipolar conduction in an IGT increases (improves) current density over a DMOSFET, by as much as a factor of 19 (IEEE Trans. on Electron Devices, Vol. ED-31, No. 6, June 84, pg. 821).

Bipolar mode conduction is intended in the three regions 62, 18, and 24*a*, respectively, which form PNP transistor QL in the lower three regions of IGT 60*b*. However, regions 62, 18 and 24*a*, plus fourth region 28*b* unfortunately constitute a thyristor. If the collector current of transistor QL along path 50 sufficiently forward biases portions of junction 27*b* removed from terminal 32*a*, the three regions 18, 24*a*, and 28*b* operate as a parasitic bipolar NPN transistor QP (FIG. 2*b*). With transistors QL and QP both conducting, the four layer thyristor structure 60*b* "latches" into a self-perpetuating state of bipolar conduction, which cannot be turned off by removing the voltage bias on gate 22*b* to stop FET mode conduction. Thus control through gate 22*b* over the bipolar current is lost. Regions of IGTs 60*a*, 60*c*, and 60*d* function identically to correspondingly numbered but differently lettered regions of IGT 60*b*.

To switch power between terminals 68 and 32*a* at increased voltage differences, in prior art IGT designs the voltage drop along critical path 50 has been limited, as in DMOS transistors, by reducing the width of source well 28*b*, and hence reducing the length of critical path 50. U.S. Pat. No. 4,443,931 to Baliga increases the size and conductivity of collector wells 24 in deep wells 66*a* and 66*b* remote from critical paths 50, to divert current and thus reduce the voltage drop along critical path 50 in an IGT and thereby reduce the forward voltage bias from well 24*a* to region 28*b* across junction 27*b*. The prior art patents cited above are hereby incorporated by reference and may be consulted for further details with respect to conventional IGTs, their manufacture and/or use.

An enlarged and more conductive well 66*a* diverts some current from critical path 50 and increases the latching current density of IGT 60*b*. However, collector wells of increased size and conductivity are of limited effectiveness in diverting current from critical path 50. Hole current tends to flow only within a diffusion length of the electron current path (which is through channel 26*b*), so not enough hole current is diverted through deep well 66*a*. Controllable current density ratings of conventional IGTs are still limited by latching caused by current along critical path 50. It is therefore desirable to further increase the latching current density of IGTs to expand their range of reliable and useful operation.

SUMMARY

In accordance with one feature of the invention, an IGT array structure is provided which comprises a plurality of IGT cells wherein each IGT cell in said array comprises a substrate of first conductivity type semiconductor material, an epitaxial layer of second conductivity type semiconductor material formed on the substrate, said epitaxial layer having an upper surface, a layer of gate insulation formed on the upper surface, a gate formed on the layer of insulation, a first well of first conductivity type material formed in said epitaxial layer beneath the upper surface and laterally adjacent the gate so that only a portion of said first well extends beneath the gate on a first side of the gate, a source region of second conductivity type material formed in the first well, a second well formed exclusively of first conductivity type material formed in said epitaxial layer beneath the upper surface and laterally adjacent the gate on a second side of the gate opposite the first side, said second well being separated from said first well by a portion of said epitaxial layer, said second well being deeper and more conductive than said first well, and conductive means ohmically connecting together said first conductivity type wells, and wherein adjacent IGT cells share a common second well.

In accordance with another feature of the invention, an IGT array structure as described in the above featured invention is provided in which the second well associated with each of the IGT cells comprises a substantially rectangular perimeter of first conductivity type material around the gate and first well of each of the IGT cells, and wherein each side of the second well forms the common second well shared by adjacent IGT cells.

In accordance with another feature of the invention, an IGT array as described in the immediately preceding featured invention is provided in which the second well further comprises a substantially octagonal region of first conductivity type material centered at each of four corners of the rectangular perimeter.

BRIEF DESCRIPTION OF THE DRAWING

FIG. 1a is a cross section through a prior art DMOS transistor;

FIG. 1b is an enlarged view of part of FIG. 1a;

FIG. 2a is a cross section of a prior art IGT;

FIG. 2b is an equivalent circuit diagram of part of the IGT structure of FIG. 2a;

FIG. 3a is a cross section through the preferred embodiment of an IGT device according to this invention;

FIG. 3b is a modification to the circuit of FIG. 2b to show the second collector 76b;

FIGS. 4 through 9 are steps in a process for making an IGT according to this invention.

DETAILED DESCRIPTION

Figure 1B:
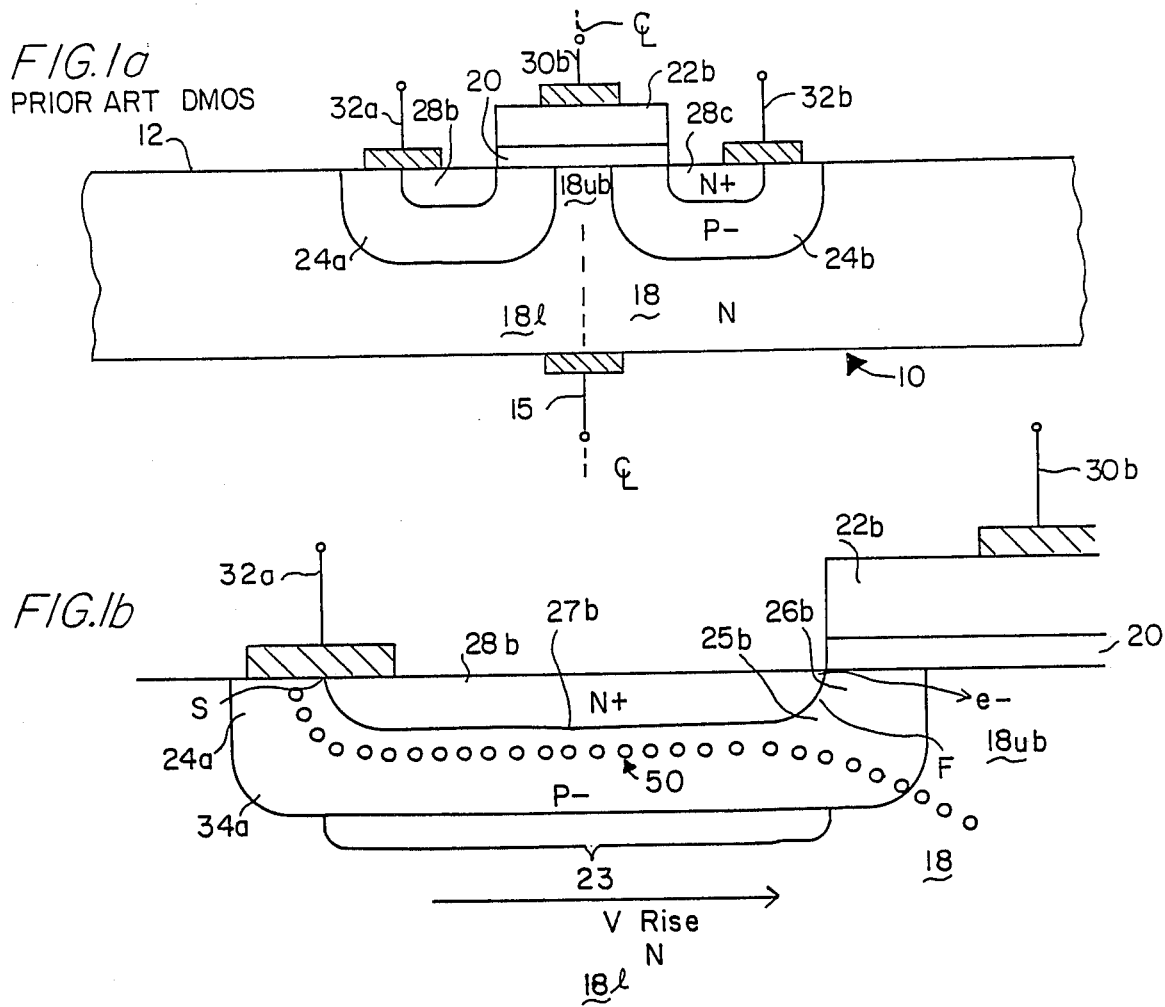
Figure 3C:
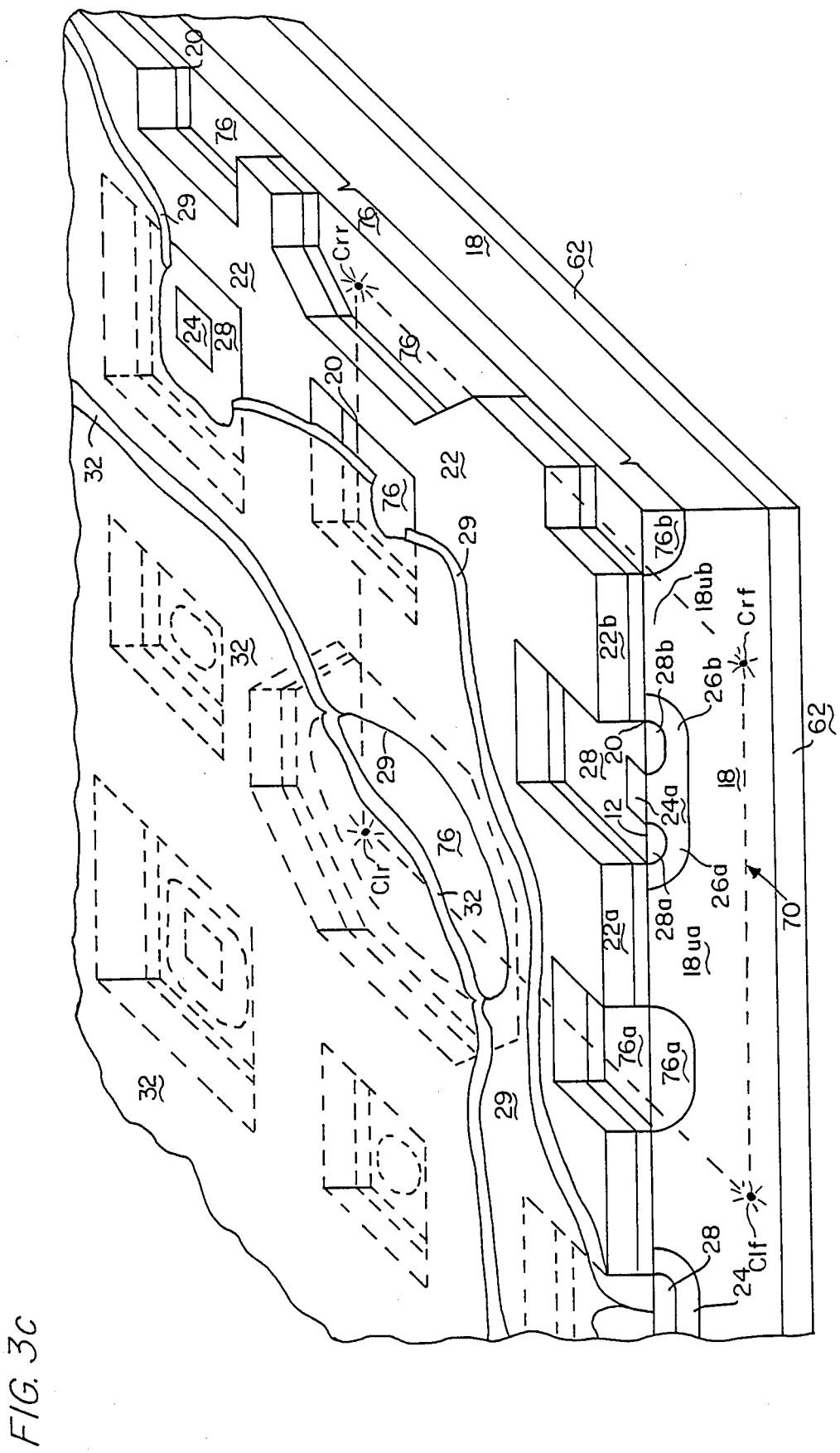
FIG. 3c is an isometric view showing the layout of an IGT device in one embodiment of the invention.

The present invention modifies insulated gate transistors to reduce their susceptibility to latching, thereby increasing their current density rating. The invention is illustrated in a preferred embodiment as IGT 70 in FIGS. 3a, 3b, and 3c, which are not drawn to scale. Relative to a conventional IGT 60b, IGT 70 has a collector well 76b, laterally adjacent drain region 18ub below one side of gate 22b, which is larger and more conductive than collector well 24a. IGT 70 includes regions which correspond to and are numbered the same as regions of conventional DMOS FET 10 or IGT 60b shown in FIGS. 1a, 1b, and 2a. IGT 70 of this invention differs from prior art IGT devices in that instead of having adjacent IGT's 60b and 60c share gate 22b which bridges a pair of prior art collector wells 24a and 24b, each containing a respective source region 28b and 28c, IGT 70 has one collector well 24a which contains a source region 28b, and has a second collector well 76b which, unlike IGTs 60, does not contain a source region 28c, and does not have a pinched low conductivity region 23 for forming a channel 26. Transistor QL in the circuit of FIG. 2b is modified by the invention as shown in FIG. 3b to form transistor QL' including second collector region 76b, which is not contiguous with a source region 28. Collector well 76b is exclusively of high, preferably P+ type (e.g., concentration = $10^{18}$ atoms/cm$^3$) conductivity material. High conductivity second collector well 76b, not having a source region, cannot latch. Furthermore, high conductivity collector well 76b serves as the primary collector of transistor QL' and thus reduces the possibility of latching in well 24a by diverting a significant portion of the current which would otherwise flow out (now secondary) collector 24a along critical path 50.

The structure of IGT 70 as shown in FIG. 3a can be expanded to form a larger IGT device as shown in the partially cut away isometric view of FIG. 3c. In FIG. 3c, a center provided by collector well 24a, and surrounding concentric squares 28, 22, 18u and 76, together form an IGT cell 70, with other corners Clf, Crf, Clr, and Crr at the centers of adjacent octagonal-shaped regions 76. In this embodiment sources 28a and 28b are two parts of the same region 28, and gates 22a and 22b are two parts of a continuous gate layer 22. The cell pattern is repeated by adjacent cells, each centered on a respective collector 24 and sharing one side with cell 70. The eight collector regions 76 forming the corners and sides of a given cell are connected by lateral diffusions under wafer surface 12 beneath portions of gate layer 22. Gate layer 22 crosses these diffused connections between regions 76 in order that polycrystalline silicon 22 for all cells can be connected together to one terminal preferably at a lateral edge of overlying collector metallization 32. Depending upon the specific biasing conditions intended for the IGT device, polycrystalline silicon 22 can be masked and etched (in the steps of FIGS. 4 and 7) so that wells 76 extend (not shown) under gate 22 towards collector regions 24, or end at the edge of gates 22 as shown in FIG. 3c, or are spaced from the edges of gates 22 as shown in FIGS. 8, 9, 9a, and 3a.

In operation, IGT 70 is switched on by applying appropriate bias voltages to source terminal 32a, (which is preferably connected by metallization 32 to collector 76 surface 33), gate terminal 30 (not shown in FIG. 3a or 3c, but connected to polysilicon layer 22 in a convenient place), and drain/emitter terminal 68 to cause FET mode conduction of electrons from source 28b to upper drain 18ub. Although FET mode current density is less than bipolar mode current density, FET switching is faster. FET mode current to upper drain 18ub from only one source 28b on one (the left) side of region 18ub is less than the current from sources 28 on both sides as in conventional shared gate IGT devices 60. FET mode electron conduction through dain region 18 also serves as a base current which turns on bipolar transistor QL' (FIG. 3b) causing a bipolar current of holes from emitter 62 through base 18 and, primarily, out collector 76b. The FET mode current from a source 28b on one side to upper drain 18u provides sufficient current to saturate transistor QL'.

The current through IGT 70 can be controlled, i.e. stopped, over a wider nonlatching range than a prior art IGT 60, as explained above, by eliminating the channel field under gate 22b, for example, by shorting the gate terminal (not shown) to source terminal 32a to stop FET mode conduction and cut off current to base region 18 of transistor QL'.

Process steps for forming IGTs are were known in the art of semiconductor device manufacturing. Briefly, an IGT 70 with highly conductive collector wells 76 according to the invention can be made as follows. Referring to FIG. 4, the process starts with a P+ conductivity type semiconductor substrate 62 on which a layer 11, lightly doped with N type dopants to a concentration of approximately $10^{14}$ atoms/cm$^3$, is epitaxially grown to a thickness of approximately 80 to 100 microns. In the actual integrated circuit structure, the thickness of the epitaxial layer comprising drain/base 18 is about 100 mircons or about 20 times the approximately 5 micron depth of to-be-formed wells 66 and 76. Top surface 12 of epitaxial layer 11 is covered with a layer of gate oxide 20, about 0.1 microns thick, and then covered with a layer of polycrystalline silicon 22 about 0.7 microns thick. A layer of photoresist is deposited on polysilicon 22 and patterned to form a first mask, not shown. The interval or "pitch" between repetitions of IGT cells 70 in the completed integrated circuit, for example between the axes of wells 76a and 76b in FIG. 5, or between left front corner Clf and right front corner Clr in FIG. 3c, is preferably about 50 microns. In areas exposed by the first mask, polysilicon 22 and gate oxide 20 are removed to form openings through which impurities will be passed to form P+ wells 76 (FIG. 5) and N+ sources 28 (FIG. 6) in the epitaxial layer.

Referring to FIG. 5, the openings over source areas 28 are covered by a second mask M2 of photoresist, and well regions 76 are P+ doped to a concentration of about $10^{16}$ to $10^{17}$ atoms/cm$^3$ by ion implantation to a depth of about 5 microns. The second mask is removed, and a third mask M3 of photoresist is formed over well openings 76, as shown in FIG. 6. The exposed source areas 28, about six microns wide, are then N+ doped by ion implantation with N type dopants to a concentration of $5 \times 10^{19}$ atoms/cm$^3$ to a depth of about 1 micron.

The third mask M3 is removed, and, as shown in FIG. 7, a fourth mask M4 is formed over the approximately 6 micron wide parts of polysilicon 22 that will be retained as gates 22. The fourth mask may overlap the edges of the gates adjacent sources 28. Exposed area of polysilicon 22, i.e., surrounding wells 76 between gates 22, and between sources areas 28, are then removed. Alternatively, if collector well 76 metallization 32 can be insulated by SiO$_2$ layer 29, FIG. 3c, close enough to polysilicon layer 22 and if biasing levels permit, wells 76 can extend (not shown) under gates 22.

Figure 8:
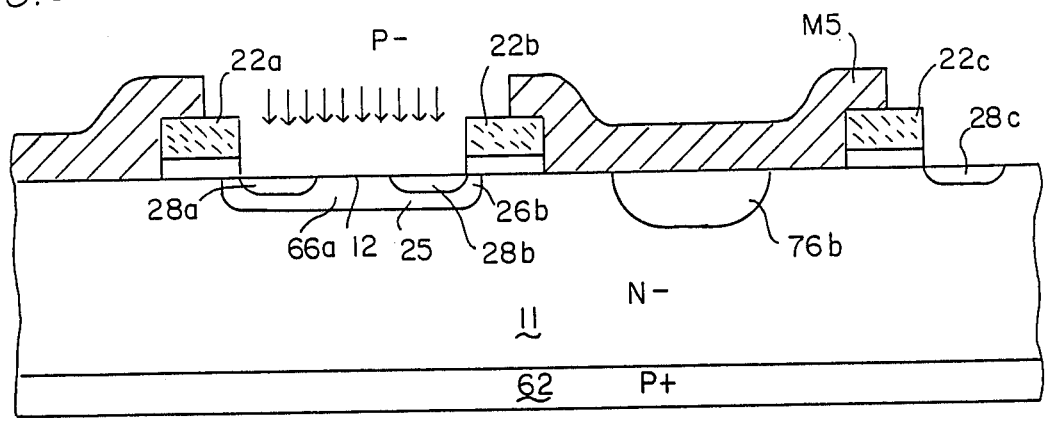

As shown in FIG. 8, a fifth mask M5 of photoresist is formed covering the just-enlarged areas around wells 76. The exposed surface 12 between pairs of source areas 28, and source areas 28 themselves, are then lightly doped with P type deposits to a concentration of about $10^{14}$ atoms/cm$^3$ to form wells 24, which diffuse laterally through sources 28 to form a pinched region in which thin walls 25 provide channels 26 approximately 3 microns wide under gates 22.

Figure 9:
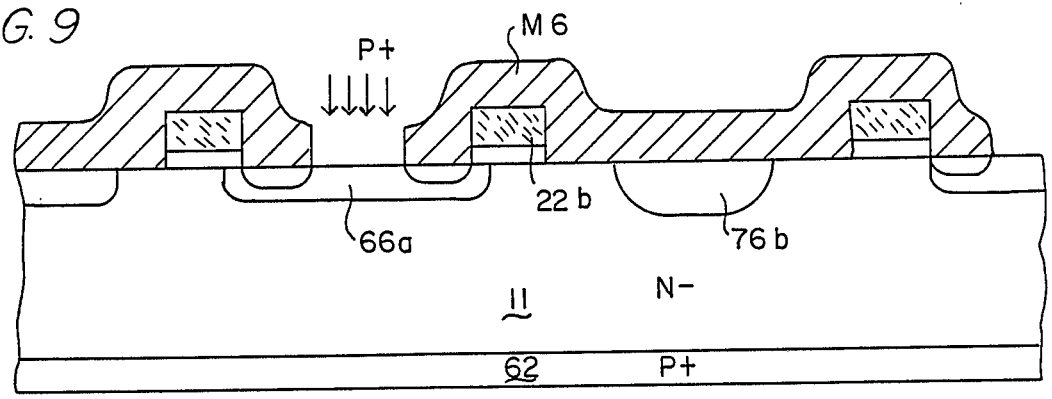

The fifth mask is then removed. If deeper and more conductive wells 66 are desired in wells 24, a sixth mask M6 is formed, as shown in FIG. 9, covering the surface of the structure except between wells 28, which is heavily doped with P ions to a concentration of $10^{17}$ to $10^{18}$ atoms/cm$^3$. Deep wells 66 are typically not as deep or as conductive as primary collector well 76. Sixth mask M6 is removed and a layer of oxide 29 (FIG. 3a) is formed over the entire structure. A seventh mask (not shown) is used in removing the oxide except around gates 22. The oxide mask is removed. An eighth mask (not shown) is used to form conductor metallizations, typically of aluminum, for gate and well contacts 30 and 32. This produces the structure shown in FIG. 3a.

Figure 9A:
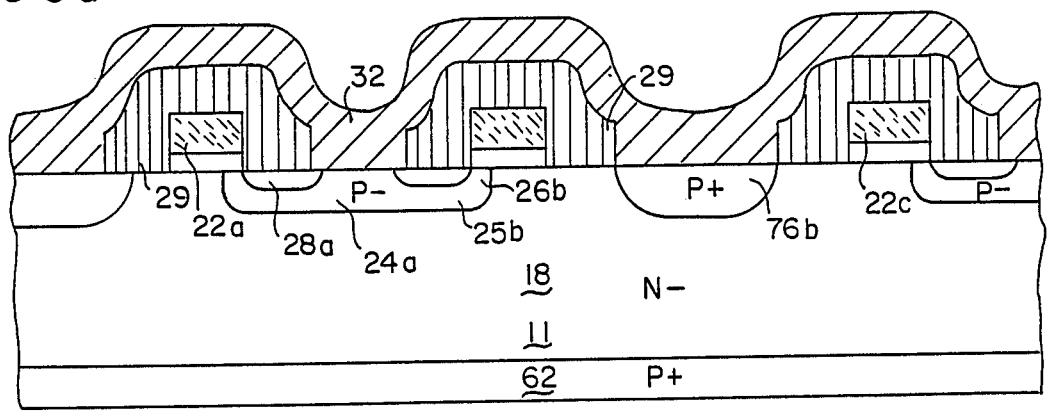
FIG. 9a is an alternative embodiment formed by alternate steps afrer step 8.

Since well 76 largely serves the purpose of diverting hole current from path 50, in some embodiments deep portion 66 is not formed in well 24, and step 9 and the sixth mask M6 are omitted. In this case, after fifth mask M5 is removed, a layer of gate-insulating oxide is formed everywhere on the structure, and a seventh mask, not shown is used to remove oxide 29 except around gates 22, as shown in FIGS. 9a and 3c. The wafer is then covered with a source contact metal layer 32 and gate terminals 30 (not shown) contacting gate polysilicon 22 typically at the lateral edge of the IGT device.

Finally, a ninth mask (not shown) is applied to form bonding pad windows for leads around the periphery of the circuit, and leads are attached. The entire device is typically covered with a passivating (protective) layer (not shown) over metal layer 32.

A preferred embodiment has been illustrated, of which modifications and adaptations within the scope of the invention will occur to those skilled in the art. The invention can, for example, be fabricated with the N-type and P-type conductivities all interchanged. Also, source wells 28 and collector wells 24 and 76 can be formed by diffusion rather than implantation. The structure described can be combined with other devices to fabricate high power circuits. The invention is limited only by the scope of the following claims.

We claim:

1. An IGT array structure comprising a plurality of IGT cells wherein each IGT cell in said array comprises:
   a substrate of first conductivity type semiconductor material;
   an epitaxial layer of second conductivity type semiconductor material formed on the substrate, said epitaxial layer having an upper surface;
   a layer of gate insulation formed on the upper surface;
   a gate formed on the layer of insulation;
   a first well of first conductivity type material formed in said epitaxial layer beneath the upper surface and laterally adjacent the gate so that only a portion of said first well extends beneath the gate on a first side of the gate;
   a source region of second conductivity type material formed in the first well;
   a second well formed exclusively of first conductivity type material formed in said expitaxial layer beneath the upper surface and laterally adjacent the gate on a second side of the gate opposite the first side, said second well being separated from said first well by a portion of said epitaxial layer, said second well being deeper and more conductive than said first well; and
   conductive means ohmically connecting together said first conductivity type wells, and wherein adjacent IGT cells share a common second well.

2. The IGT array structure of claim 1 wherein said second well associated with each of said IGT cells comprises a substantially rectangular perimeter of first conductivity type material around said gate and first well of each of said IGT cells, and wherein each side of said second well forms said common second well shared by adjacent IGT cells.

3. The IGT array structure of claim 2 wherein said second well further comprises a substantially octagonal region of first conductivity type material centered at each of four corners of said rectangular perimeter.

* * * * *

UNITED STATES PATENT AND TRADEMARK OFFICE
CERTIFICATE OF CORRECTION

PATENT NO. : 4,779,123

DATED : October 18, 1988

INVENTOR(S) : Izak Bencuya, et al.

It is certified that error appears in the above-identified patent and that said Letters Patent is hereby corrected as shown below:

Col. 1; line 17, "case" should read --base--.

Col. 5, line 53, "afrer" should read --after--.

Col. 6, line 62, "dain" should read --drain--.

Signed and Sealed this

Twenty-eighth Day of March, 1989

Attest:

DONALD J. QUIGG

*Attesting Officer*     *Commissioner of Patents and Trademarks*